US006285073B1

(12) United States Patent
Cooper et al.

(10) Patent No.: US 6,285,073 B1
(45) Date of Patent: Sep. 4, 2001

(54) CONTACT STRUCTURE AND METHOD OF FORMATION

(76) Inventors: Kent J. Cooper, 6001 Abilene Trail, Austin, TX (US) 78749; Scott S. Roth, 615 Eagle St., Austin, TX (US) 78734

( * ) Notice: Subject to any disclaimer, the term of this patent is extended or adjusted under 35 U.S.C. 154(b) by 0 days.

(21) Appl. No.: 08/453,689

(22) Filed: May 30, 1995

Related U.S. Application Data

(62) Division of application No. 08/188,986, filed on Jan. 31, 1994.

(51) Int. Cl.$^7$ ........................................ H01L 29/06

(52) U.S. Cl. .............. 257/648; 257/396; 257/397; 257/398; 257/399; 257/400; 257/401; 257/512; 257/521; 257/647; 257/513; 257/755; 257/760; 257/774

(58) Field of Search .................... 257/396, 397, 257/398, 399, 400, 401, 512, 521, 647, 648, 513, 755, 774, 760

(56) References Cited

U.S. PATENT DOCUMENTS

| | | | |
|---|---|---|---|
| 4,318,751 | 3/1982 | Horng | 148/1.5 |
| 4,446,476 | 5/1984 | Isaac et al. | 357/67 |
| 4,519,128 * | 5/1985 | Cheseboro et al. | 257/648 |
| 4,534,824 | 8/1985 | Chen | 156/628 |
| 4,549,927 | 10/1985 | Goth et al. | 156/643 |
| 4,656,497 | 4/1987 | Rogers et al. | 357/50 |
| 4,733,287 * | 3/1988 | Bower | 257/513 |
| 4,797,373 | 1/1989 | Malhi et al. | 437/60 |
| 4,808,555 | 2/1989 | Mauntel et al. | 437/191 |
| 4,824,793 | 4/1989 | Richardson et al. | 437/47 |
| 4,876,217 | 10/1989 | Zdebel | 437/67 |
| 4,884,123 | 11/1989 | Dixit et al. | 357/71 |
| 4,939,567 | 7/1990 | Kenney | 357/42 |
| 4,945,069 | 7/1990 | Carter | 437/67 |
| 5,003,375 * | 3/1991 | Ichikawa | 257/755 |

(List continued on next page.)

OTHER PUBLICATIONS

Szeto et al., "A Buried Contact Process For VLSI," Proceedings of the First International Symposium on Very Large Scale Integration Science and Technology, vol. 82–7, pp. 347–353., 1982.

Subbanna et al., "A Novel Borderless Contact/Interconnect Technology Using Aluminum Oxide Etch Stop for High Performance SRAM and Logic," 1993 IEDM Proceedings, pp. 441–444.

Givens et al., "Selective dry etching in a high density plasma for 0.5 um complementary metal–oxide–semiconductor technology," J. Vac. Technol. B (12) 1, Jan./Feb. 1994, pp. 427–433.

Kenney et al., "A Buried_plate Trench Cell for a 64–Mb DRAM," 1992 Symposium on VLSI Technology Digest of Technical Papers, pp. 14–15.

Kenney et al., "16–MBit Merged Isolation and Node Trench SPT Cell (Mint)," 1988 Symposium on VLSI Technology Digest of Technical Papers, pp. 25–26.

Primary Examiner—Wael Fahmy
Assistant Examiner—Matthew E. Warren

(57) ABSTRACT

The horizontal surface area required to contact semiconductor devices, in integrated circuits fabricated with trench isolation, is minimized without degrading contact resistance by utilizing the vertical surface area of the trench sidewall. A trench isolation region (40) is formed within the semiconductor substrate (12). A doped region (74, 96) is then formed such that it abuts the trench sidewall (24). A portion (56, 110) of the trench sidewall (24), abutting the doped region (74, 96), is then exposed by forming a recess (55, 112) within the trench isolation region (40). A conductive member (66, 114, 118) is then formed such that it is electrically coupled to the doped region (74, 96) along the exposed trench sidewall, as well as along the major surface (13) of the semiconductor substrate (12), and results in the formation of a low resistance contact structure.

39 Claims, 8 Drawing Sheets

U.S. PATENT DOCUMENTS

| | | | |
|---|---|---|---|
| 5,015,594 | 5/1991 | Chu et al. | 437/31 |
| 5,064,777 | 11/1991 | Dhong et al. | 437/52 |
| 5,100,823 | 3/1992 | Yamada | 437/52 |
| 5,106,777 | 4/1992 | Rodder | 437/67 |
| 5,108,938 | 4/1992 | Solomon | 437/41 |
| 5,112,772 | 5/1992 | Wilson et al. | 437/67 |
| 5,268,330 | 12/1993 | Givens et al. | 437/195 |
| 5,275,965 | 1/1994 | Manning | 437/67 |
| 5,315,142 | 5/1994 | Acovic et al. | 257/316 |
| 5,362,678 | 11/1994 | Komaru et al. | 437/203 |
| 5,389,559 | 2/1995 | Hsieh et al. | 437/52 |
| 5,395,786 | 3/1995 | Hsu et al. | 437/52 |
| 5,422,294 | 6/1995 | Nobel, Jr. | 437/52 |
| 5,457,339 | 10/1995 | Komori et al. | 257/510 |
| 5,460,987 | 10/1995 | Wen et al. | 437/40 |
| 5,482,869 | 1/1996 | Kohyama | 437/12 |
| 5,488,010 | 1/1996 | Wong | 437/53 |

\* cited by examiner

CONTACT STRUCTURE AND METHOD OF FORMATION

This is a divisional of application Ser. No. 08/188,986, filed Jan. 31, 1994.

FIELD OF THE INVENTION

This invention relates generally to semiconductor devices, and more specifically to a contact structure in an integrated circuit and its method of formation.

BACKGROUND OF THE INVENTION

The semiconductor industry continually strives to increase device performance and device density by reducing device dimensions. More specifically, in the past the area on a chip occupied by active devices, known as the active area, and area on a chip used to isolate active devices, known as the isolation area, have been reduced in order to achieve higher device packing densities and improved device performance. This continuing reduction in device dimensions, however, has also begun to adversely effect the performance and the reliability of these scaled devices. This is because device parasitics, such as contact resistance, begin to limit the performance and reliability of these devices as they are scaled.

One technique which has been proposed for reducing the area required to isolate active devices in high density integrated circuits is trench isolation. With trench isolation, field oxide encroachment into the surrounding active area is eliminated, and therefore the area required for both device isolation and active devices can be simultaneously reduced. Unfortunately, reducing the active area of a device also reduces the area available to make contact to that device. As a result, devices having submicron design rules have small contact areas, and therefore the parasitic resistance associated with contacting these submicron devices can be high because contact resistance is dependent on contact area. Moreover, at submicron dimensions the parasitic resistance associated with these small contacts becomes high enough to limit the speed at which integrated circuits perform and to degrade device reliability. Accordingly, a need exists for a contact structure that allows high density integrated circuits to be fabricated with low contact resistance.

SUMMARY OF THE INVENTION

The previously mentioned problems with existing contact structures are overcome by the present invention. In one embodiment of the invention a contact structure in an integrated circuit has a semiconductor substrate with a trench isolation region formed therein, and trench isolation region has a trench sidewall. It has a doped region lying within the semiconductor substrate and the doped region abuts the trench sidewall. It has a conductive member. The conductive member having a first portion electrically coupled to the doped region along the trench sidewall. Other aspects of the invention also involve methods for making the contact structure in an integrated circuit. These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
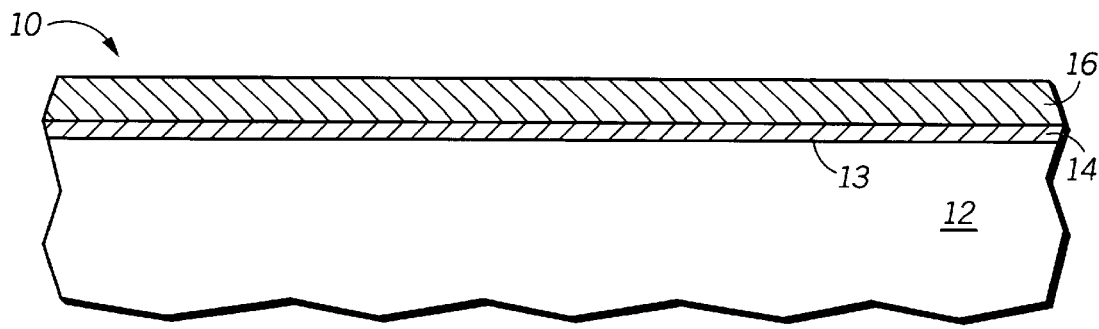
FIGS. 1–15 illustrate, in cross-section, process steps in accordance with one embodiment of the invention.

FIGS. 1 through 15 illustrate, in cross-section, process steps in accordance with one embodiment of the invention wherein a contact structure is formed in an integrated circuit. Shown in FIG. 1 is a portion 10 of an integrated circuit structure comprising a semiconductor substrate 12 having a major surface 13, a buffer layer 14, and an oxidation resistant layer 16. Semiconductor substrate 12 is preferably a monocrystalline silicon substrate. Alternatively, semiconductor substrate 12 may also be a silicon on insulator substrate, a silicon on sapphire substrate, or the like. Semiconductor substrate 12 is preferably thermally oxidized to form buffer layer 14, which may have a thickness ranging from 3 to 100 nanometers. Alternatively, buffer layer 14 may be chemical vapor deposited silicon dioxide or even a laminate comprising a layer of chemical vapor deposited silicon dioxide overlying a layer of thermal silicon dioxide. Following the formation of buffer layer 14, oxidation resistant layer 16 is formed over buffer layer 14. In accordance with a preferred embodiment, oxidation resistant layer 16 is preferably chemical vapor deposited silicon nitride, which may have a thickness ranging from 10 to 200 nanometers. Alternatively, oxidation resistant layer 16 may also be another material, such as boronitride or silicon oxynitride.

Figure 2:
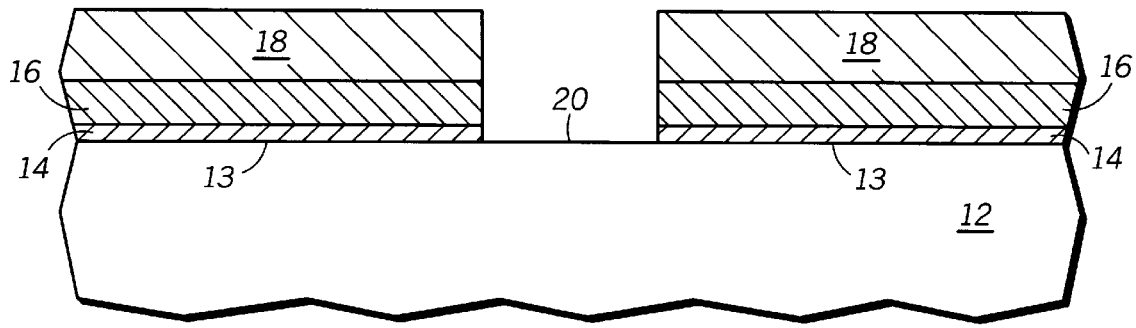

In FIG. 2, a photoresist mask 18, which overlies a portion of oxidation resistant layer 16, is used to pattern oxidation resistant layer 16 and underlying buffer layer 14 so that a first portion 20 of major surface 13 is exposed. Photoresist mask 18 is formed using standard photolithographic patterning processes, and oxidation resistant layer 16 and buffer layer 14 are patterned using standard etching techniques.

Figure 3:
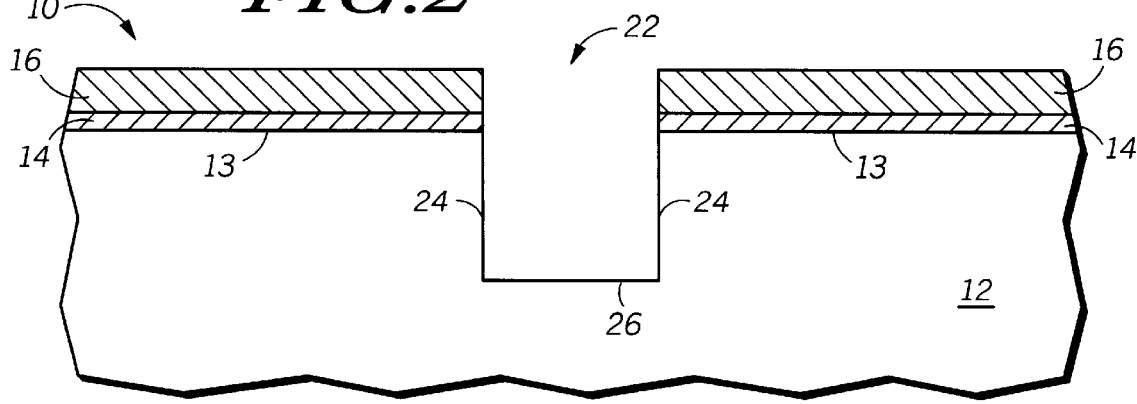

In FIG. 3, first portion 20 of major surface 13 is then anisotropically etched using standard etching techniques to form a trench 22 within semiconductor substrate 12. Trench 22 has a trench sidewall 24 and a trench bottom 26. After trench 22 has been formed, photoresist mask 18 is then removed using standard photoresist stripping techniques.

Figure 4:
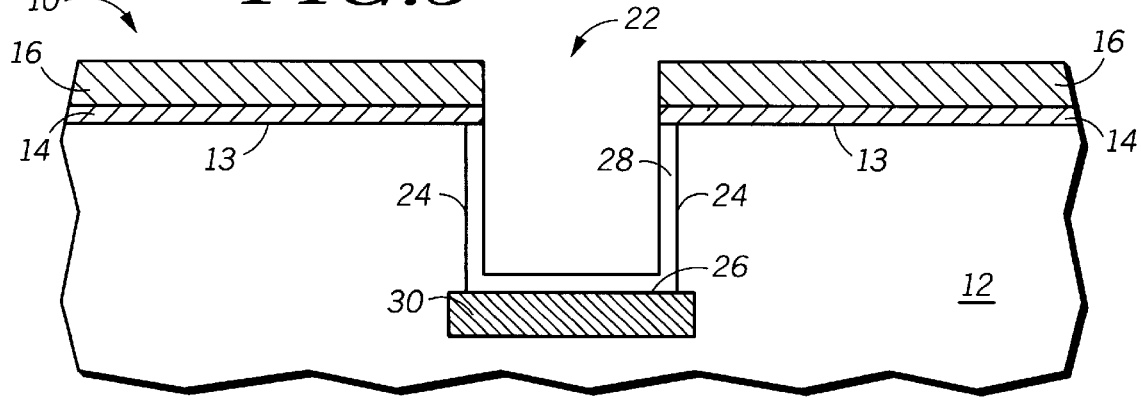

In FIG. 4, trench sidewall 24 and trench bottom 26 are oxidized to form a layer of thermal silicon dioxide 28 that abuts trench sidewall 24. In a preferred embodiment thermal silicon dioxide layer 28 has a thickness ranging from 5 to 100 nanometers. Alternatively, a layer of chemical vapor deposited silicon dioxide may also be formed such that it abuts trench sidewall 24. In addition, as shown in FIG. 4, a portion of silicon substrate 12 underlying trench bottom 26 may also be implanted with ions to form a channel stop region 30 adjacent to trench bottom 26. Channel stop region 30 may be formed either before or after thermal silicon dioxide layer 28.

Figure 5:
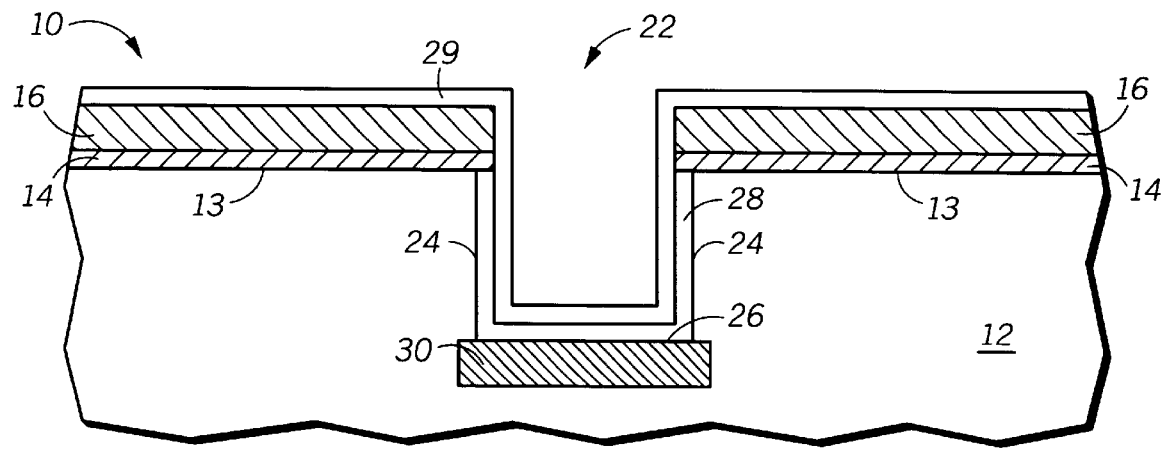

In FIG. 5, a layer of silicon nitride 29 is then formed adjacent to thermal silicon dioxide layer 28. In a preferred embodiment silicon nitride layer 29 is chemically vapor deposited and has a thickness ranging from 5 to 100 nanometers. Alternatively, another material that can also be selectively etched with respect to thermal silicon dioxide layer 28, such as boronitride, boroxynitride, polysilicon, or germanium doped polysilicon may also be used. The significance of choosing a material that can be selectively removed with respect to thermal silicon dioxide layer 28 will become apparent later.

Figure 6:
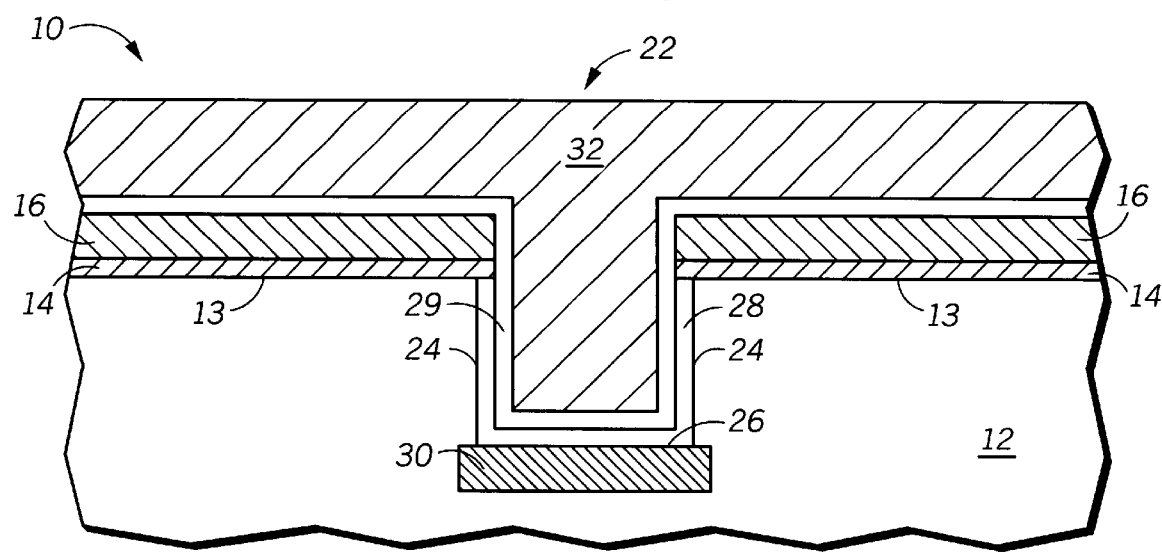

In FIG. 6, a trench fill material 32 is then formed overlying silicon nitride layer 29, such that trench 22 is substantially filled. In a preferred embodiment, trench fill material 32 is undoped chemically vapor deposited silicon dioxide, which is deposited using ozone and tetraethylorthosilicate (TEOS) as source gases. Alternatively, trench fill material 32 may also be doped silicon dioxide, such as germanium doped silicon dioxide or another dielectric material, such as silicon nitride. In addition, trench fill material 32 may be formed using other techniques such as plasma enhanced chemical vapor deposition, electron cyclotron resonance deposition, or spin-on deposition.

Figure 7:
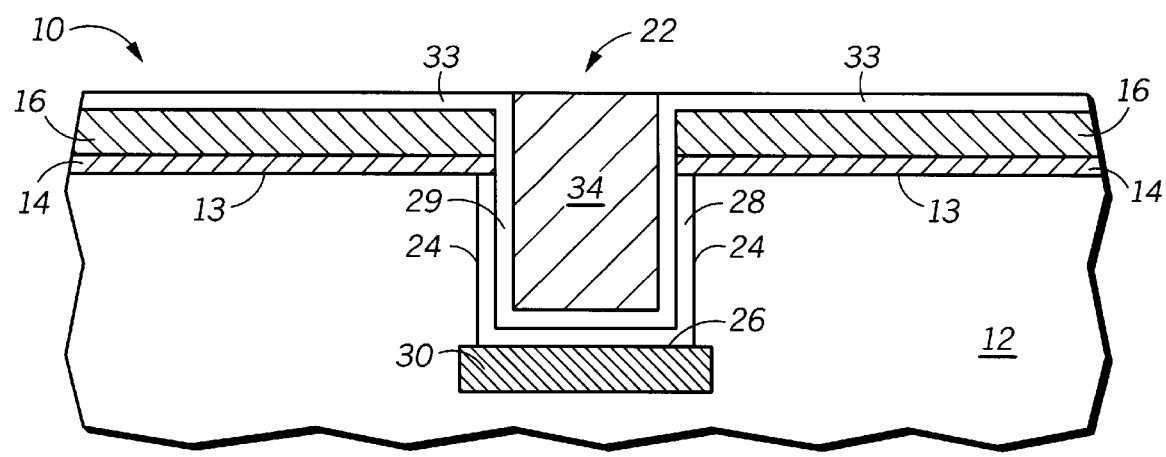

In FIG. 7, a portion of trench fill material 32 is then selectively removed to expose a portion 33 of silicon nitride layer 29, and to form a dielectric plug 34 that lies within and substantially fills trench 22. In a preferred embodiment, chemical mechanical polishing is used to selectively remove a portion of trench fill material 32 and form dielectric plug 34. Alternatively, standard wet or plasma etching techniques may also be used to form trench plug 34, or a combination of chemical mechanical polishing and standard etching techniques may also be used to form trench plug 34.

Figure 8:
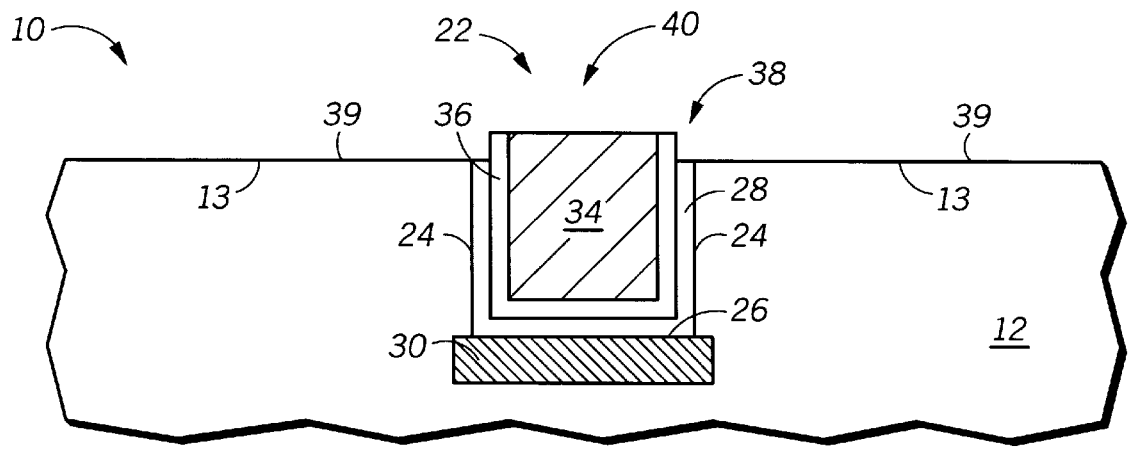

In FIG. 8, exposed portion 33 of silicon nitride layer 29 is then removed to leave a remaining portion 36 of silicon nitride layer 29 lying within trench 22, and to form a composite trench liner 38, wherein composite trench liner 38 comprises remaining portion 36 and thermal silicon dioxide layer 28. Oxidation resistant layer 16 and buffer layer 14 are then removed to expose a portion 39 of major surface 13, and to form a trench isolation region 40 within a portion of semiconductor substrate 12, wherein trench isolation region 40 comprises trench 22, composite trench liner 38 and dielectric plug 34, and channel stop region 30. In accordance with a preferred embodiment, wherein oxidation resistant layer 16 is silicon nitride and buffer layer 14 is silicon dioxide, oxidation resistant layer 16 and exposed portion 33 of silicon nitride 29 may be removed in phosphoric acid and buffer layer 14 may be removed in buffered hydrofluoric acid. Alternatively, oxidation resistant layer 16 and exposed portion 33 of silicon nitride 29 may also be removed using standard dry etching techniques. In addition, in FIG. 8 remaining portion 36 may also be formed such that it does not extend above major surface 13.

Figure 9:
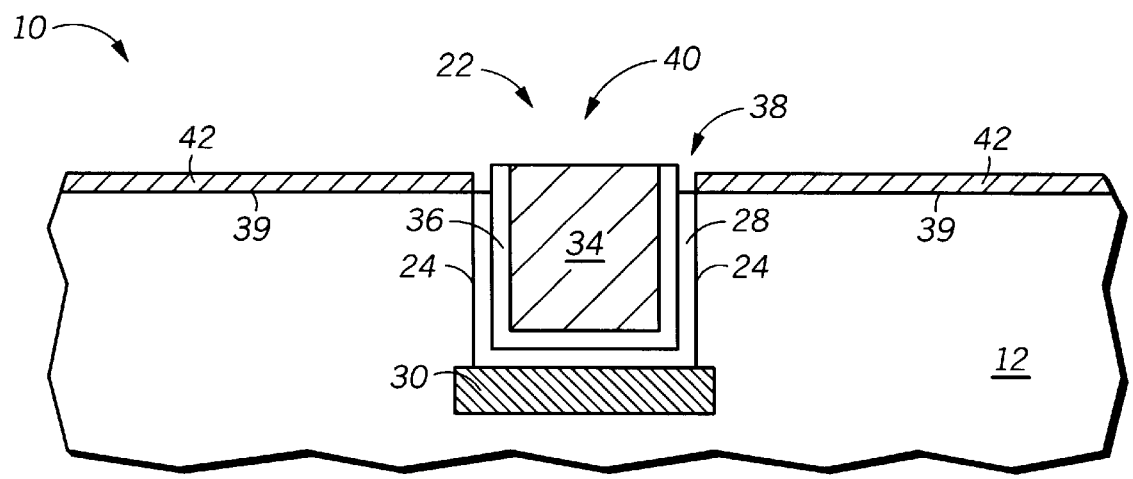

In FIG. 9, a gate dielectric layer 42 is then formed overlying exposed portion 39 of major surface 13. In a preferred embodiment gate dielectric layer 42 is thermal silicon dioxide, which is formed by thermally oxidizing exposed portion 39. Alternatively, gate dielectric layer 42 may be chemical vapor deposited silicon dioxide, a laminate comprising a layer of chemical vapor deposited silicon dioxide overlying a layer of thermal silicon dioxide, or even another dielectric material such as silicon oxynitride. In addition, a sacrificial layer of thin thermal oxide may be formed over exposed portion 39, and then subsequently stripped prior to forming gate dielectric layer 42.

Figure 10:
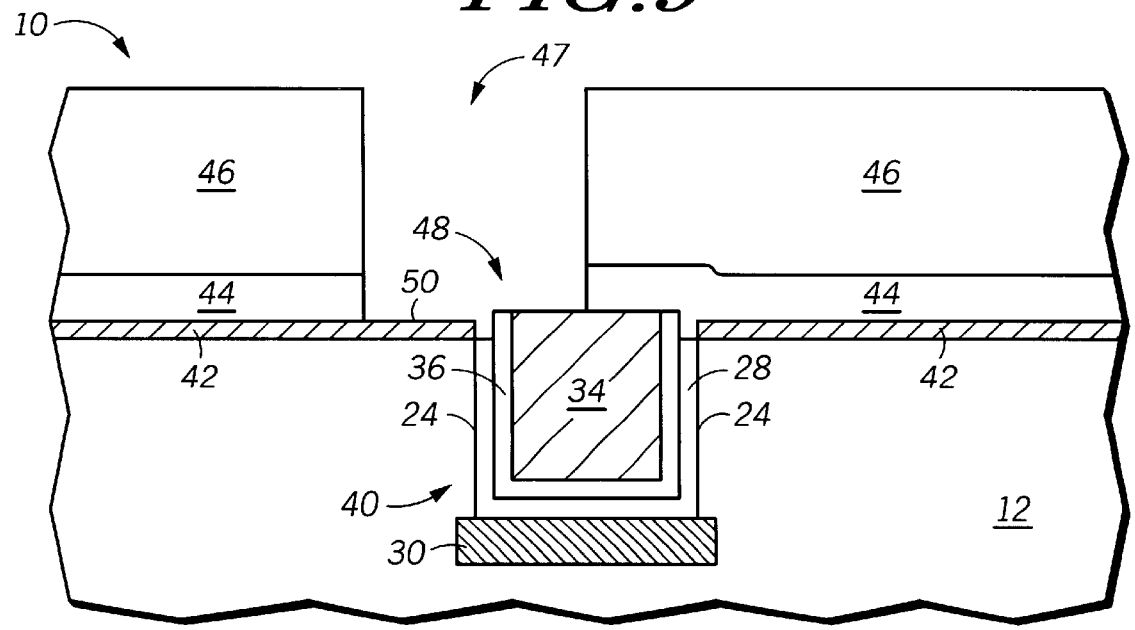

In FIG. 10, a first conductive layer 44 of material is then formed overlying gate dielectric layer 42 and trench isolation region 40. First conductive layer 44 may have a thickness ranging from 5 to 100 nanometers, and is preferably a layer of undoped polysilicon having a thickness of approximately 50 nanometers, which is deposited using conventional chemical vapor deposition techniques. Alternatively, first conductive layer 44 may also be a layer of doped polysilicon or a layer of either doped or undoped amorphous silicon. A photoresist mask 46 is then formed to expose a portion of first conductive layer 44 and to define a contact region 47 that overlies a portion of composite trench liner 38. The exposed portion of first conductive layer 44 is then patterned such that a portion 48 of composite trench liner 38, and a portion 50 of gate dielectric layer 42 are exposed within contact region 47. In FIG. 10, photoresist mask 46 is formed using standard photolithographic patterning processes, and the exposed portion of first conductive layer 44 is etched using standard etching techniques. In addition, although not illustrated contact region 47 may also be implanted with p or n type dopants, prior to removing photoresist mask 46, in order to form an implanted region within a portion of semiconductor substrate 12 that abuts trench sidewall 24.

Figure 11:
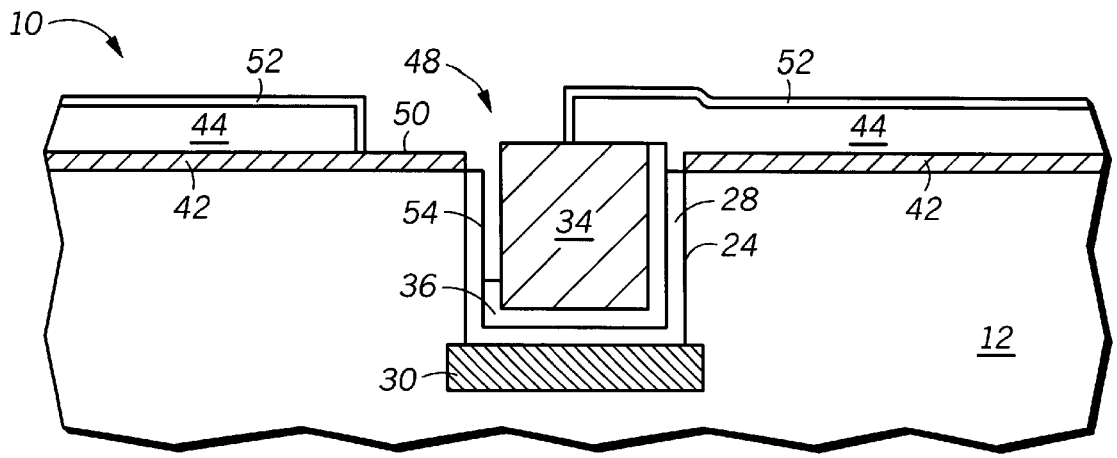

In FIG. 11, photoresist mask 46 is removed using standard stripping techniques, and first conductive layer 44 is then encapsulated within a protective layer of thermal silicon dioxide 52. Thermal silicon dioxide layer 52 is formed by thermally oxidizing first conductive layer 44 and has a thickness ranging from 5 to 50 nanometers. In addition, in FIG. 11 a thin layer of oxide or oxynitride may also be formed on the exposed surface of remaining portion 36. However, because conductive layer 44 is more readily oxidized than remaining portion 36, the layer of oxide or oxynitride that may be formed has a thickness that is less than that of thermal silicon dioxide layer 52. In a preferred embodiment thermal silicon dioxide layer 52 is formed by oxidizing first conductive layer 44 at a temperature of approximately 1000 degrees Celsius in an ambient comprising dry oxygen. Exposed portion 48 of composite trench liner 38 is then selectively etched such that remaining portion 36 is recessed into trench 22 and an exposed portion 54 of thermal silicon dioxide layer 28 is formed. During the etch, silicon dioxide layer 52 prevents first conductive layer 44 from being etched. Similarly, gate dielectric layer 42 and thermal silicon dioxide layer 28 also prevent semiconductor substrate 12 from being etched. In a preferred embodiment, a deglaze etch is performed prior to selectively etching remaining portion 36. The deglaze etch removes the thin layer of oxide or oxynitride that may have formed on remaining portion 36, and thins silicon dioxide layer 52, exposed portion 50, and thermal silicon dioxide layer 28. In accordance with a preferred embodiment, a dilute hydrofluoric acid solution is preferably used for the deglaze etch. Remaining portion 36 is then recessed into trench 22 using an isotropic etch, which is selective with respect to silicon dioxide. In a preferred embodiment remaining portion 36 is etched using a conventional chemical dry etch. Alternatively, remaining portion 36 may be wet etched using phosphoric acid. In addition, it should be noted that the thicknesses used for thermal silicon dioxide layer 52, gate dielectric layer 42, and thermal silicon dioxide layer 28 are dependent on the selectivity of the recess etch, and on the selectivity of the deglaze etch if it is also used.

Figure 12:
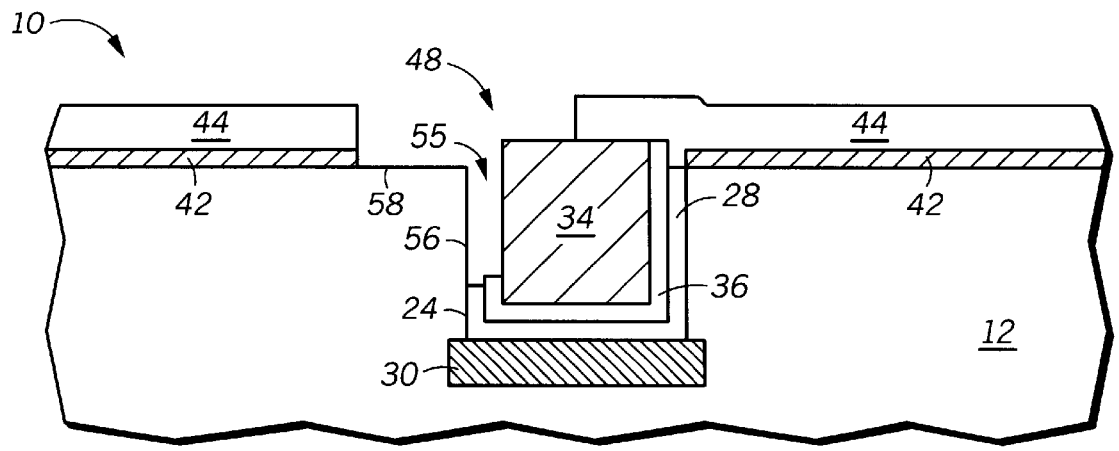

In FIG. 12, exposed portion 48 of composite trench liner 38 is then selectively etched to remove exposed portion 54 and to form an exposed portion 56 of trench sidewall 24 and to form a recess 55 within trench 22. In addition, thermal silicon dioxide layer 52 and exposed portion 50 of gate dielectric layer 42 are also simultaneously removed along with exposed portion 54, and therefore, a portion 58 of major surface 13 is also exposed. As shown in FIG. 12, by exposing portion 56 of trench sidewall 24, in addition to exposing portion 58 of major surface 13, the surface area that is available for making contact to semiconductor substrate 12 is increased. Therefore, the horizontal area required to make contact to semiconductor substrate 12 may be minimized without degrading the contact resistance to semiconductor substrate 12 because the exposed vertical surface of trench sidewall 34 increases the area available for making contact to semiconductor substrate 12. In a preferred embodiment, exposed portion 54 is selectively removed with respect to semiconductor substrate 12 and first conductive layer 44 using an isotropic etchant. In accordance with a preferred embodiment exposed portion 54 may be wet etched using hydrofluoric acid or vapor etched using a hydrofluoric acid vapor.

Figure 13:
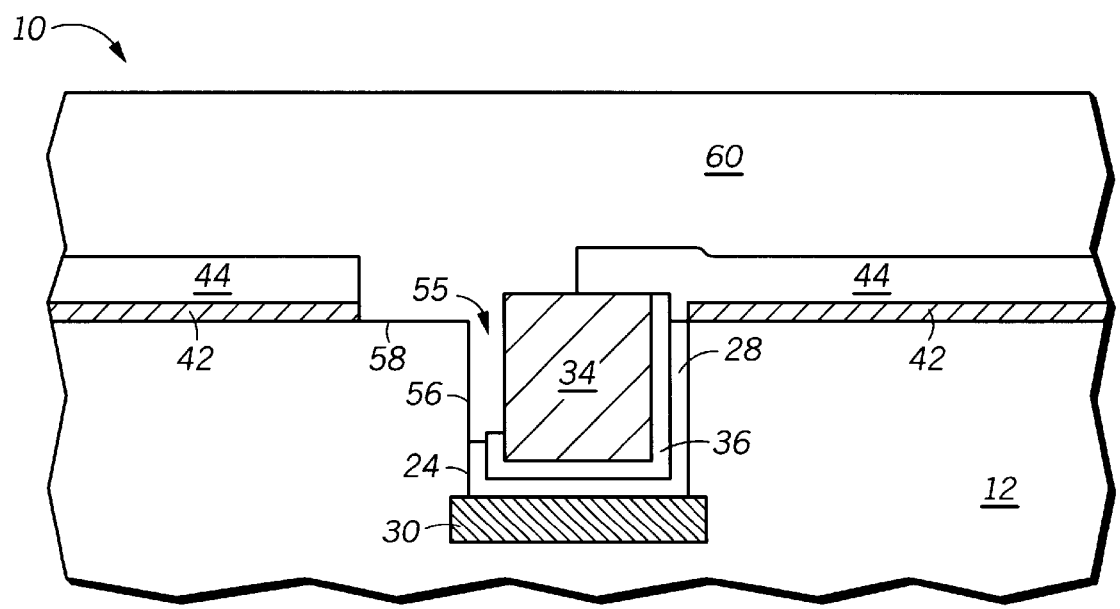

In FIG. 13, a second conductive layer 60 of material is then deposited. Second conductive layer 60 overlies first conductive layer 44 and lies within recess 55 such that it abuts the exposed portion 56 of trench sidewall 24. In addition, second conductive layer 60 also abuts exposed portion 58 of major surface 13. In a preferred embodiment, second conductive layer 60 is a layer of doped polysilicon, which is deposited using conventional deposition techniques and doped using conventional techniques, such as insitu-doping, ion implantation, or diffusion. At this time, it should be appreciated that the polysilicon layer may be doped either n or p type. Alternatively, conductive layer 60 may be a layer of undoped polysilicon, a refractory metal layer, such as tungsten, titanium, or molybdenum, or a metal silicide layer, such as tungsten silicide, titanium silicide, cobalt silicide, molybdenum silicide, et cetera, or even a laminate comprising a metal or metal silicide layer overlying a doped or undoped polysilicon layer.

Figure 14:
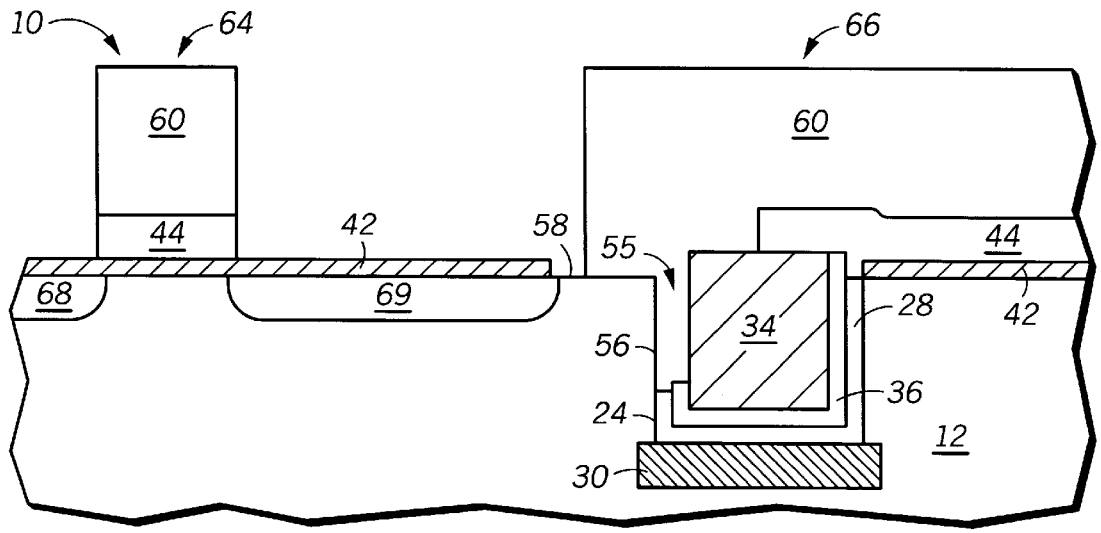

In FIG. 14, second conductive layer 60 and first conductive layer 44 are then patterned using conventional photolithographic patterning and etching techniques to form a first conductive member 64 and a second conductive member 66. Semiconductor substrate 12 is then ion implanted to form implanted regions 68 and 69 within a portion of semiconductor substrate 12, wherein first conductive member 64 and second conductive member 66 are used as self-aligned implant masks. It should be appreciated that implanted regions 68 and 69 may be formed having either a p or n type conductivity. Moreover, if first conductive member 64 and second conductive member 66 are formed using a layer of undoped polysilicon, then this layer can also be doped when implanted regions 68 and 69 are formed. It should also be noted that although FIG. 14 illustrates second conductive member 66 overlying only a portion of exposed portion 58 it may also be formed such that it completely covers exposed portion 58. In addition, prior to implantation a thin layer of thermal silicon dioxide may also be formed over exposed portions of semiconductor substrate 12 and first conductive member 64 and second conductive member 66.

Figure 15:
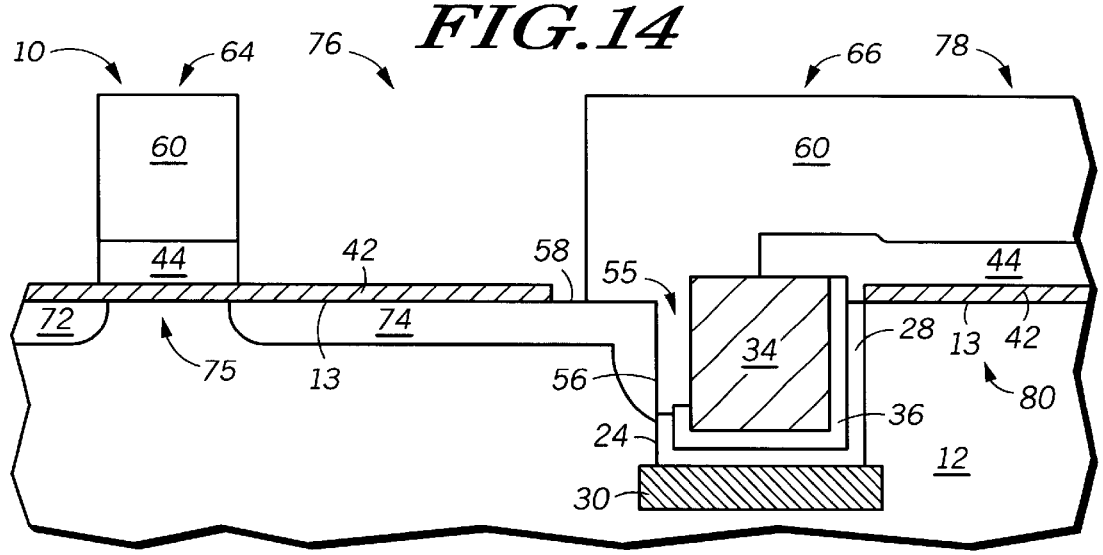

In FIG. 15, semiconductor substrate 12 is annealed in order to electrically activate the dopants within implanted regions 68 and 69. Additionally, in accordance with a preferred embodiment, wherein second conductive member 66 comprises doped polysilicon, second conductive member 66 also acts as a diffusion source during the anneal and portions of semiconductor substrate 12 that abut conductive member 66 are also doped with a dopant that is of the same conductivity type as that in implanted regions 68 and 69. As shown in FIG. 15, the anneal results in the formation of a doped region 72 and a doped region 74, wherein doped region 74 abuts trench sidewall 24. Doped regions 72 and 74 define a channel region 75 for a first transistor 76 and form the source/drain electrodes for first transistor 76. In addition, first conductive member 64 forms the gate electrode for first transistor 76. Similarly, second conductive member 66 forms the gate electrode for a second transistor 78, wherein the source/drain electrodes for second transistor 78 are located on opposite sides of its channel region 80 and the source/drain electrodes extend into and out of the cross sectional plane shown in FIG. 15. In addition, it should be pointed out that the source/drain electrodes for second transistor 78 may be formed with a dopant having the same conductivity type as that of doped regions 72 and 74 or with a dopant having a different conductivity type. Second conductive member 66 is electrically coupled to doped region 74 and a first portion abuts doped region 74 along trench sidewall 24 and a second portion overlies doped region 74 and abuts it along major surface 13. Furthermore, a third portion of second conductive member 66 lies over channel region 80 and serves as the gate electrode for second transistor 78. In addition, it should also be appreciated that doped region 74 may also be formed without using second conductive member 66 as a diffusion source. As previously described in FIG. 10, contact region 47 may be implanted with dopant prior to the formation of second conductive member 66 in order to form an implanted region abutting trench sidewall 24. Therefore, this implanted region in combination with implanted region 69 can be used to form doped region 74. Furthermore, this invention allows static memory cells in microprocessors or static memories to have small cell sizes. This is because the horizontal surface area required to electrically couple the source or drain electrode of a first transistor to the gate electrode of a second transistor within a given static memory cell can be minimized.

Figure 16:
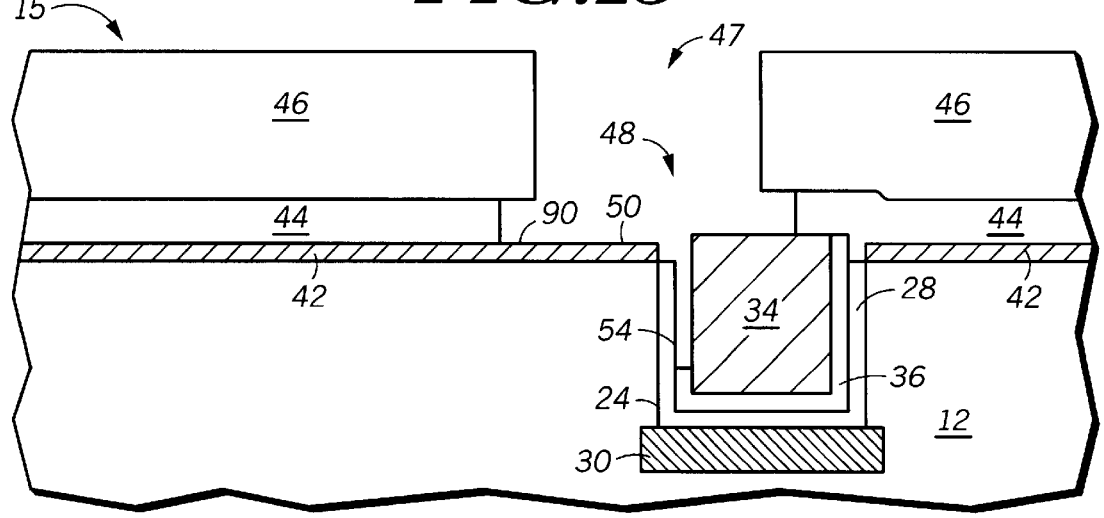
FIGS. 16–17 illustrates, in cross-section, process steps in accordance with an alternative embodiment of the invention.
Figure 17:
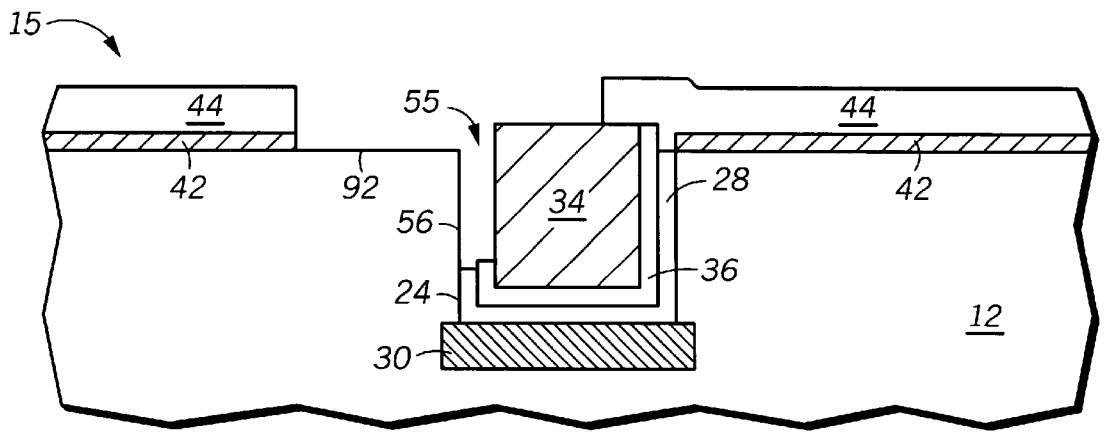

FIGS. 16 through 17 illustrate, in cross-section, process steps in accordance with an alternative embodiment of the invention wherein a contact structure is formed in an integrated circuit. Shown in FIG. 16 is a portion 15 of an integrated circuit structure that is analogous to that shown in FIG. 10, wherein after first conductive layer 44 has been patterned remaining portion 36 is then non-selectively etched with respect to first conductive layer 44. As shown in FIG. 16, remaining portion 36 is recessed into trench 22 to form exposed portion 54 of thermal oxide layer 28. In addition, first conductive layer 44 is also etched and recessed under photoresist mask 46 to expose a portion 90 of gate dielectric layer 42. However, it should be noted that if remaining portion 36 can be selectively etched with respect to conductive layer 44, then conductive layer 44 will not be recessed under photoresist mask 46. In a preferred embodiment remaining portion 36 is etched using a conventional chemical dry etch. Alternatively, remaining portion 36 may be wet etched using phosphoric acid. Once again, it should be noted that the thicknesses used for gate dielectric layer 42, and thermal silicon dioxide layer 28 are dependent on the selectivity of the recess etch. In addition, although not illustrated contact region 47 may also be implanted with p or n type dopants, prior to removing photoresist mask 46, in order to form an implanted region within a portion of semiconductor substrate 12 that abuts trench sidewall 24.

In FIG. 17, after photoresist mask 46 has been removed exposed portion 48 of composite trench liner 38 is then selectively etched to remove exposed portion 54 of thermal silicon dioxide layer 28, thus forming an exposed portion 56 of trench sidewall 24 and a recess 55 within trench 22. In addition, exposed portions 50 and 90 of gate dielectric layer 42 are also simultaneously removed along with exposed portion 54, and therefore, a portion 92 of major surface 13 is also exposed. As shown in FIG. 17, by exposing portion 56 of trench sidewall 24, in addition to exposing portion 92 of major surface 13, the surface area that is available for making contact to semiconductor substrate 12 is increased. Therefore, the horizontal area required to make contact to semiconductor substrate 12 may be minimized without degrading the contact resistance to semiconductor substrate 12 because the exposed vertical surface of trench sidewall 24 increases the area available for making contact to semiconductor substrate 12. In a preferred embodiment, exposed portion 54 is selectively removed with respect to semiconductor substrate 12 and first conductive layer 44 using an isotropic etchant. In accordance with a preferred embodiment exposed portion 54 may be wet etched using hydrofluoric acid or vapor etched using a hydrofluoric acid vapor. Following the removal of exposed portion 54 processing continues as previously described in FIG. 13 through FIG. 16.

Figure 18:
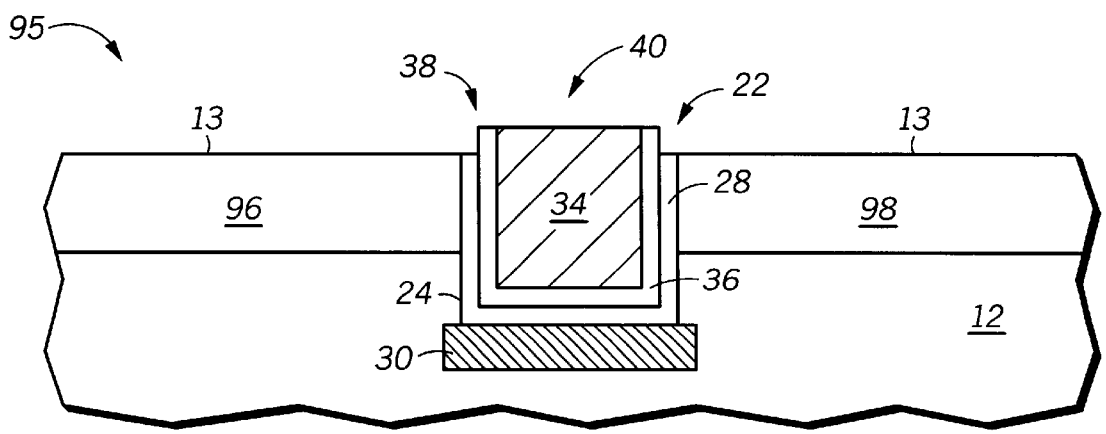
FIGS. 18–23 illustrates, in cross-section, process steps in accordance with an alternative embodiment of the invention.

FIGS. 18 through 23 illustrate, in cross-section, process steps in accordance with an alternative embodiment of the invention wherein a contact structure is formed in an integrated circuit. Shown in FIG. 18 is a portion 95 of an integrated circuit structure that is analogous to that shown in FIG. 8, wherein after trench isolation region 40 has been formed a doped region 96 and a doped region 98 are formed within portions of semiconductor substrate 12. In a preferred embodiment doped regions 96 and 98 are formed using ion implantation and doped region 96 serves as a source or drain electrode for a first transistor and doped region 98 serves as a source or drain electrode for a second transistor. Alternatively, doped regions 96 and 98 may be well regions formed within semiconductor substrate 12. Doped regions 96 and 98 may have either a p or n type conductivity. In addition, doped region 96 may be formed to have a conductivity type different from that of doped region 98.

Figure 19:
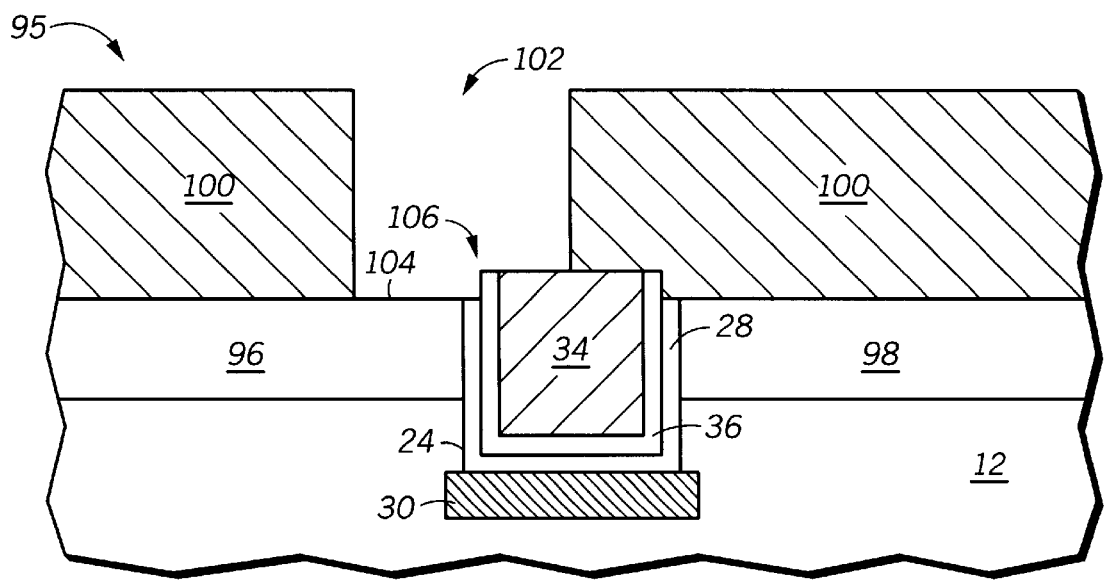

In FIG. 19, a dielectric layer 100 is formed overlying trench isolation region 40 and doped regions 96 and 98. Dielectric layer 100 is then subsequently patterned to define a contact region 102 and to expose a portion 104 of major surface 13 and to expose a portion 106 of composite trench liner 38. Dielectric layer 100 is formed using conventional deposition techniques and subsequently patterned using conventional photolithographic patterning and etching techniques.

Figure 20:
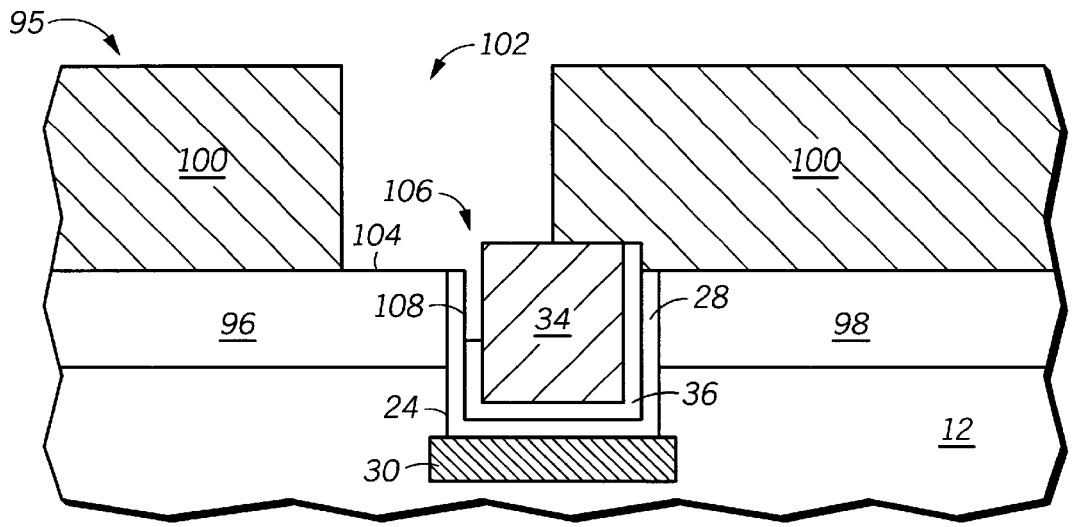

In FIG. 20, exposed portion 106 of composite trench liner 38 is then selectively etched such that remaining portion 36 is recessed into trench 22 and an exposed portion 108 of thermal silicon dioxide layer 28 is formed. In a preferred embodiment remaining portion 36 is selectively etched with an isotropic etchant, such as phosphoric acid.

Figure 21:
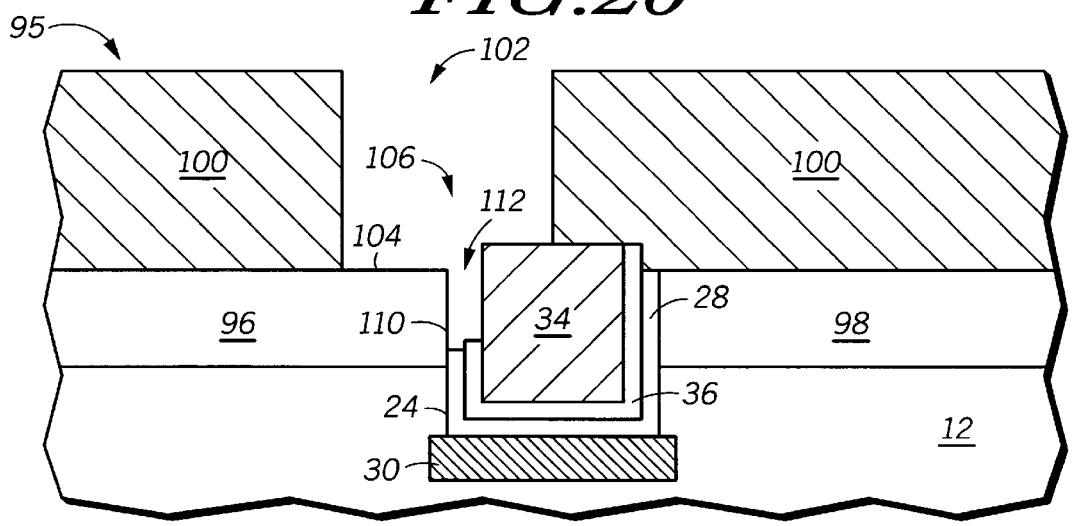

In FIG. 21, exposed portion 106 of composite trench liner 38 is then selectively etched to remove exposed portion 108 and to form an exposed portion 110 of trench sidewall 24 and to form a recess 112 within trench trench isolation region 40. In a preferred embodiment, exposed portion 108 is selectively removed with respect to semiconductor substrate 12 using an isotropic etchant. In accordance with a preferred embodiment exposed portion 108 may be wet etched using hydrofluoric acid or vapor etched using a hydrofluoric acid vapor.

Figure 22:
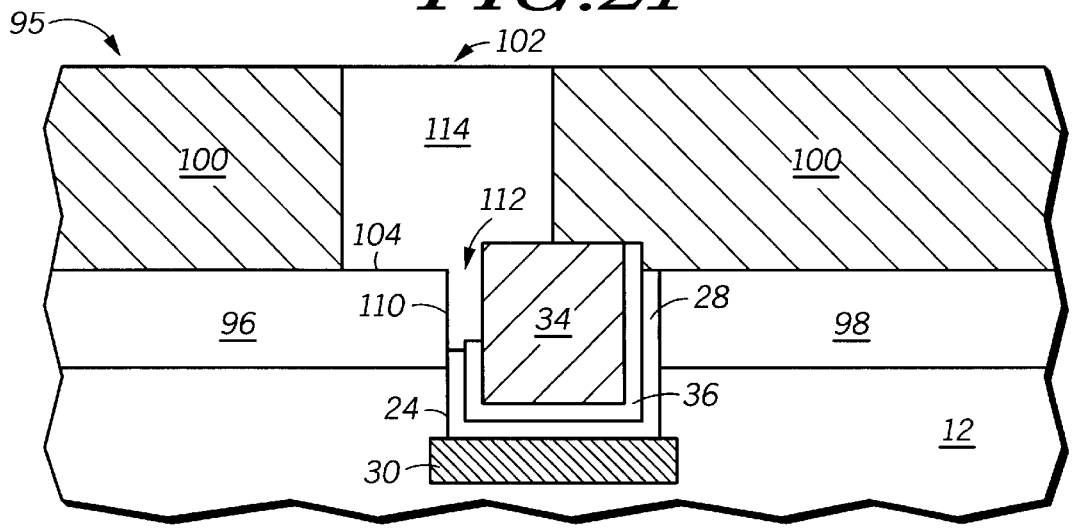

In FIG. 22, a conductive member 114 is then formed within contact region 102 such that it is substantially filled. As shown in FIG. 22, a first portion of conductive member 114 lies within recess 112 and abuts doped region 96 along trench sidewall 24, and a second portion of conductive member 114 overlies doped region 96 and abuts it along exposed portion 104 of major surface 13. Therefore, conductive member 114 is electrically coupled to doped region 96 along trench sidewall 24 and along major surface 13. In one embodiment conductive member 114 is a laminated contact plug comprising titanium silicide, titanium nitride and tungsten, wherein the laminated contact plug has a layer of titanium silicide abutting doped region 96 along exposed surfaces 104 and 110, a barrier layer of titanium nitride overlying the titanium silicide layer, and a tungsten plug adjacent to the titanium nitride barrier layer. Alternatively, the laminated contact plug may be formed using other conductive materials, such as molybdenum or titanium-tungsten. In addition, conductive member 114 may also be a doped polysilicon contact plug that is formed using conventional deposition and etching techniques. The laminated contact plug may be formed by sputter depositing a layer of titanium over exposed surfaces 104 and 110, and then sputter depositing a layer of titanium nitride over the titanium layer. The titanium layer preferably has a thickness ranging from 10 to 100 nanometers and the titanium nitride layer preferably has a thickness ranging from 20 to 80 nanometers. Alternatively, the titanium and the titanium nitride layers may also be deposited by chemical vapor deposition. In addition, a portion of the titanium layer may also be reacted with a nitrogen containing ambient, such as ammonia, to form the titanium nitride layer. After the titanium nitride layer has been formed a layer of tungsten is then chemically vapor deposited overlying the titanium nitride layer such that contact region 102 is substantially filled. In addition, during the tungsten deposition process portions of the titanium layer that overlie exposed surfaces 104 and 110 are also converted into a self-aligned layer of titanium silicide. Portions of the conductive layers are then selectively removed using standard etching techniques to form conductive member 114.

Figure 23:
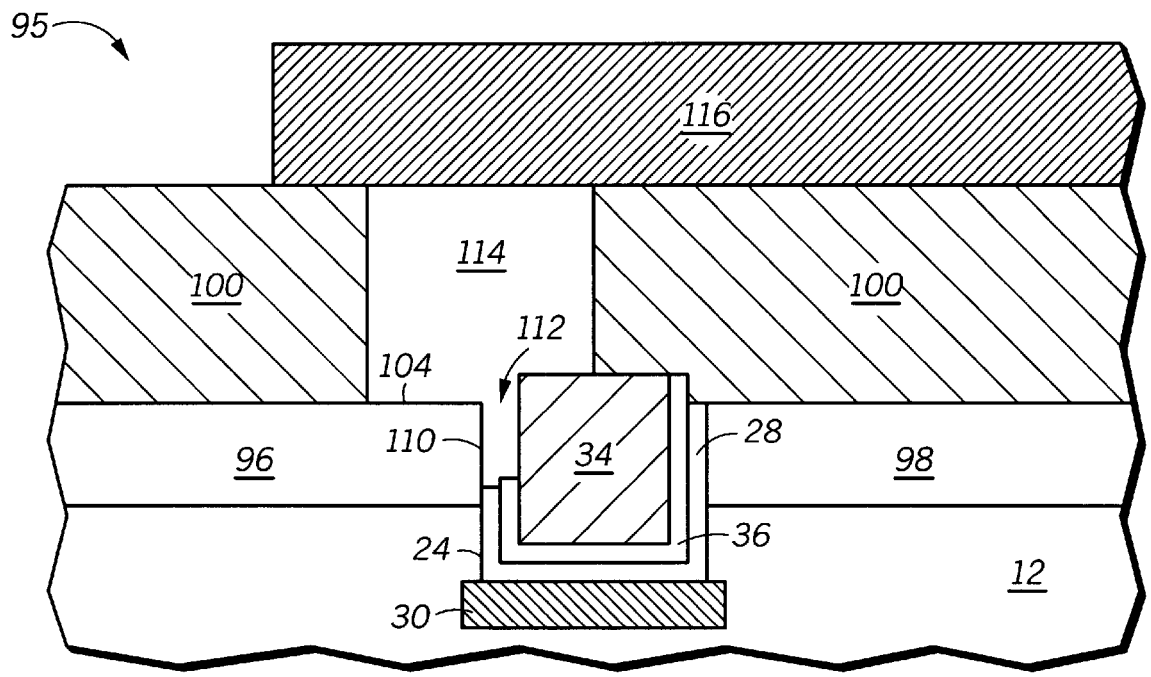

In FIG. 23, a metal interconnect 116 is then formed overlying conductive member 114 using standard deposition, photolithographic patterning, and etching techniques. In one embodiment metal interconnect 116 is a laminated layer comprising aluminum and titanium nitride, wherein an aluminum layer lies between two layers of titanium nitride. Alternatively, metal inteconnect 116 may be formed using other conductive materials such as copper or molybdenum.

Figure 24:
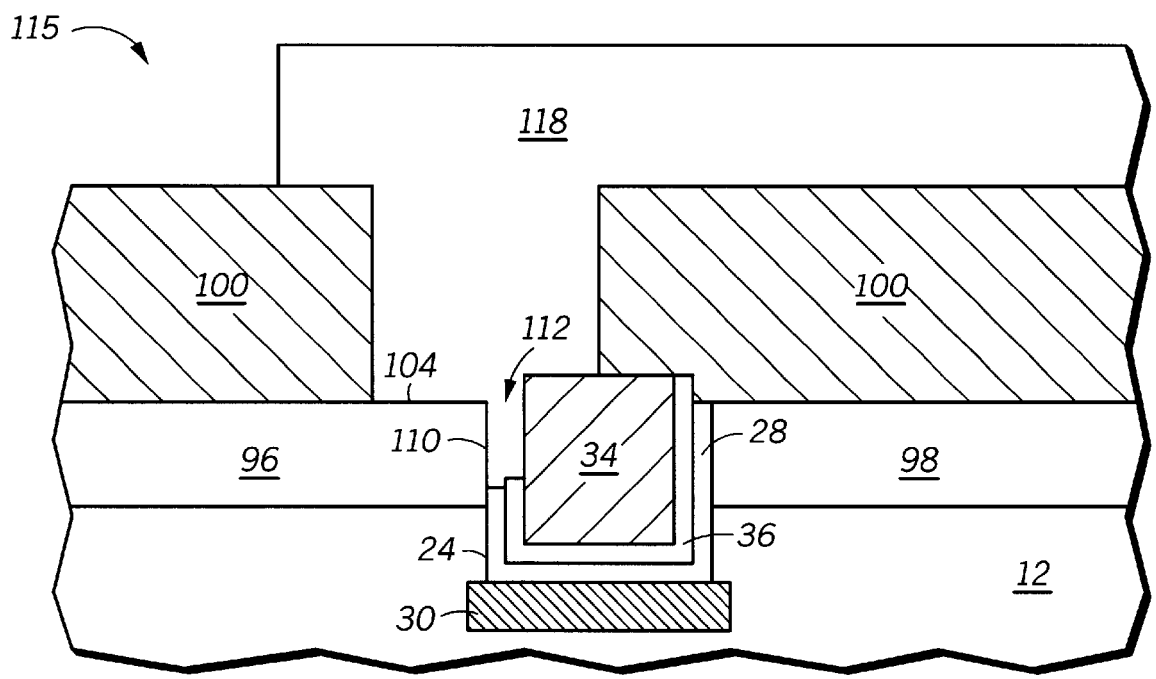
FIG. 24 illustrates, in cross-section, an alternative embodiment of the invention.

FIG. 24 illustrates, in cross-section, an alternative embodiment of the invention wherein a contact structure is formed in an integrated circuit. Shown in FIG. 24 is a portion 115 of an integrated circuit structure that is analogous to that shown in FIG. 22, wherein a conductive member 118 is formed within contact region 102 such that it is substantially filled. As shown in FIG. 24, a first portion of conductive member 118 lies within recess 112 and is adjacent to trench sidewall 24, and a second portion of conductive member 118 overlies doped region 96. Therefore, conductive member 118 is electrically coupled to doped region 96 along trench sidewall 24 and along major surface 13. In addition a third portion of conductive member 118 overlies dielectric layer 100 and serves as a metal interconnect. In one embodiment conductive member 118 comprises titanium silicide, titanium nitride and tungsten and is formed as previously described in FIG. 23, except that the subsequent patterning process forms a conductive member that also has a portion that overlies dielectric layer 100. Alternatively, conductive member 118 may also be formed with other conductive materials such as polysilicon, copper, aluminum, or molybdenum.

The foregoing description and illustrations contained herein demonstrate many of the advantages associated with the present invention. In particular, the horizontal surface area required to make contact to a semiconductor substrate can be minimized without degrading contact resistance. More specifically, a recess may be formed within a trench isolation region such that a portion of the trench sidewall can be used to increase the total contact area, and therefore contacts having a small horizontal contact area and low contact resistance can be achieved. Moreover, because the horizontal area required for contacts can be minimized, without degrading contact resistance, this allows device dimensions to be scaled further, and thus allows integrated circuits with higher device densities and improved reliability to be manufactured.

Thus it is apparent that there has been provided, in accordance with the invention, a contact structure in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific trench shape, depth or width. Furthermore, the invention is not limited to a specific etch process or etch chemistry. In addition, it is not intended that this invention be limited to materials specifically recited herein. Moreover, the invention is not limited to a specific number of layers for the trench liner, or to specific liner materials. Therefore, it is intended that this invention encompass all such variations and modifications as fall within the scope of the appended claims.

What is claimed is:

1. A contact structure in an integrated circuit comprising:
a semiconductor substrate having a major surface;
a trench isolation region lying within a first portion of the semiconductor substrate, the trench isolation region comprising a trench having a trench sidewall;
a first field effect transistor having a source/drain electrode lying within a second portion of the semiconductor substrate, the source/drain electrode having a first portion and a second portion, the first portion having a first depth and a first width and the second portion having a second depth and a second width, wherein the first depth is greater than the second depth and the first width is less than the second width, and the first portion of the source/drain electrode abuts the trench sidewall; and
a conductive member overlying the trench isolation region, the conductive member having a first portion extending into the trench adjacent to the trench sidewall, wherein the first portion of the conductive member is electrically shorted to the first portion of the source/drain electrode of the first field effect transistor.

2. The contact structure of claim 1, wherein the conductive member is further characterized as having a second portion overlying the the source/drain electrode of the first field effect transistor, wherein the second portion of the conductive member is electrically shorted to a portion of the source/drain electrode that abuts the major surface.

3. The contact structure of claim 1, wherein the conductive member is further characterized as a gate electrode for a second field effect transistor.

4. The contact structure of claim 1, wherein the conductive member is further characterized as a contact plug.

5. The contact structure of claim 4, wherein the contact plug comprises a material selected from the group consisting of tungsten, titanium nitride, titanium silicide, and polysilicon.

6. The contact structure of claim 1, wherein the conductive member comprises polysilicon.

7. The contact structure of claim 1, wherein the conductive member is further characterized as a laminate comprising a metal silicide layer overlying a polysilicon layer.

8. The contact structure of claim 1, wherein the trench isolation region is further characterized as comprising a dielectric plug, wherein the dielectric plug lies within the trench and substantially fills the trench.

9. The contact structure of claim 8, wherein the dielectric plug comprises a material selected from the group consisting of silicon dioxide and silicon nitride.

10. A contact structure in an integrated circuit comprising:
a semiconductor substrate having a major surface;
a trench isolation region lying within a first portion of the semiconductor substrate, the trench isolation region comprising a trench having a trench sidewall;
a first field effect transistor, the first field effect transistor having a source/drain electrode lying within a second portion of the semiconductor substrate, the source/drain electrode having a first portion and a second portion, the first portion having a first depth and a first width and the second portion having a second depth and a second width, wherein the first depth is greater than the second depth and the first width is less than the second width, and the first portion of the source/drain electrode abuts the trench sidewall; and
a second field effect transistor having a gate electrode, the gate electrode having a first portion that lies within the trench and abuts the trench sidewall, wherein the first portion of the gate electrode is electrically shorted to the first portion of the source/drain electrode of the first field effect transistor.

11. The contact structure of claim 10, wherein the gate electrode is further characterized as having a second portion that overlies the source/drain electrode of the first field effect transistor and abuts a portion of the source/drain electrode that abuts the major surface.

12. The contact structure of claim 10, wherein the gate electrode comprises polysilicon.

13. The contact structure of claim 10, wherein the gate electrode is further characterized as a laminate comprising a metal silicide layer overlying a polysilicon layer.

14. The contact structure of claim 10, wherein the trench isolation region is further characterized as comprising a dielectric plug, wherein the dielectric plug lies within the trench and substantially fills the trench.

15. The contact structure of claim 14, wherein the dielectric plug comprises a material selected from the group consisting of silicon dioxide and silicon nitride.

16. A contact structure in an integrated circuit comprising:
a semiconductor substrate having a major surface;
a trench lying within a first portion of the semiconductor substrate, the trench having a trench sidewall;
a first field effect transistor having a source/drain electrode lying within a second portion of the semiconductor substrate, the source/drain electrode having a first portion with a first depth and a second portion with a second depth, wherein the first depth is greater than the second depth, and the first portion of the source/drain electrode abuts the trench sidewall;
a dielectric plug lying within the trench and substantially filling the trench; and
a second field effect transistor having a gate electrode comprising a first polysilicon layer underlying a second polysilicon layer, the gate electrode overlying the dielectric plug and having a first portion extending into the trench and abutting the trench sidewall, wherein the first portion of the gate electrode is electrically shorted to the first portion of the source/drain electrode of the first field effect transistor.

17. The contact structure of claim 16, wherein the second field effect transistor is further characterized as having a channel region wherein the channel region underlies the gate electrode and abuts the trench sidewall.

18. The contact structure of claim 16, wherein a portion of the second polysilicon layer extends into the trench and abuts the trench sidewall.

19. The contact structure of claim 16, wherein the dielectric plug comprises a material selected from the group consisting of silicon dioxide and silicon nitride.

20. The contact structure of claim 16, wherein a portion of the first polysilicon layer overlies the dielectric plug.

21. A contact structure in an integrated circuit comprising:
a semiconductor substrate having a major surface;
a trench lying within a first portion of the semiconductor substrate, the trench having a trench sidewall;
a first field effect transistor having a source/drain electrode lying within a second portion of the semiconductor substrate, the source/drain electrode having a first portion with a first depth and a second portion with a second depth, wherein the first depth is greater than the second depth, and the first portion of the source/drain electrode abuts the trench sidewall;
a dielectric plug lying within the trench and substantially filling the trench; and
a conductive member overlying the dielectric plug, the conductive member having a first portion lying within the trench and abutting the trench sidewall, wherein the first portion of the conductive member is electrically shorted to the first portion of the source/drain electrode of the first field effect transistor.

22. The contact structure of claim 21, wherein the conductive member is further characterized as having a second portion overlying the source/drain electrode of the first field effect transistor, wherein the second portion of the conductive member is electrically shorted to a portion of the source/drain electrode that abuts the major surface.

23. The contact structure of claim 21, wherein the conductive member is further characterized as a gate electrode for a second field effect transistor.

24. The contact structure of claim 21, wherein the conductive member is further characterized as a contact plug.

25. The contact structure of claim 24, wherein the contact plug comprises a material selected from the group consisting of tungsten, titanium nitride, titanium silicide, and polysilicon.

26. The contact structure of claim 24, further comprising a conductive interconnect overlying the contact plug and electrically shorted to the contact plug.

27. The contact structure of claim 21, wherein the conductive member comprises polysilicon.

28. The contact structure of claim 21, wherein the conductive member is further characterized as a laminate comprising a metal silicide layer overlying a polysilicon layer.

29. The contact structure of claim 21, wherein the dielectric plug comprises a material selected from the group consisting of silicon dioxide and silicon nitride.

30. A contact structure in an integrated circuit comprising:
a semiconductor substrate having a major surface;
a trench isolation region lying within a first portion of the semiconductor substrate, the trench isolation region comprising a trench having a trench sidewall;
a first field effect transistor having a source/drain electrode lying within a second portion of the semiconductor substrate, the source/drain electrode having a first portion with a first depth and a second portion with a second depth, wherein the first depth is greater than the second depth, and the first portion of the source/drain electrode abuts the trench sidewall; and
a second field effect transistor having a gate electrode overlying the trench isolation region, the gate electrode having a first portion lying within the trench and abutting the trench sidewall, wherein the first portion of the gate electrode is electrically shorted to the first portion of the source/drain electrode of the first field effect transistor.

31. The contact structure of claim 30, wherein the gate electrode is further characterized as having a second portion overlying the source/drain electrode of the first field effect transistor, wherein the second portion of the conductive member is electrically shorted to a portion of the source/drain electrode that abuts the major surface.

32. The contact structure of claim 30, wherein the second field effect transistor is further characterized as having a channel region underlying the gate electrode, wherein a portion of the channel region abuts the trench sidewall.

33. The contact structure of claim 32, wherein the gate electrode comprises a first silicon layer underlying a second silicon layer.

34. The contact structure of claim 33, wherein a portion of the first silicon layer overlies the trench isolation region.

35. The contact structure of claim 30, wherein the gate electrode comprises polysilicon.

36. The contact structure of claim 30, wherein the gate electrode is further characterized as a laminate comprising a metal silicide layer overlying a polysilicon layer.

37. The contact structure of claim 30, wherein the trench isolation region is further characterized as comprising a dielectric plug, wherein the dielectric plug lies within the trench and substantially fills the trench.

38. The contact structure of claim 37, wherein the dielectric plug comprises a material selected from the group consisting of silicon dioxide and silicon nitride.

39. The contact structure of claim 32, wherein the second transistor is further characterized as having a gate dielectric layer overlying the channel region, wherein the gate dielectric layer abuts the trench isolation region.

* * * * *